United States Patent
Wadhwa et al.

(10) Patent No.: US 9,537,476 B1
(45) Date of Patent: Jan. 3, 2017

(54) LEVEL SHIFTER WITH LOW DUTY CYCLE VARIATION

(71) Applicant: FREESCALE SEMICONDUCTOR, INC., Austin, TX (US)

(72) Inventors: Sanjay K. Wadhwa, Noida (IN); Avinash Chandra Tripathi, Noida (IN)

(73) Assignee: FREESCALE SEMICONDUCTOR,INC., Austin, TX (US)

( * ) Notice: Subject to any disclaimer, the term of this patent is extended or adjusted under 35 U.S.C. 154(b) by 0 days.

(21) Appl. No.: 14/990,745

(22) Filed: Jan. 7, 2016

(51) Int. Cl.
| | |
|---|---|
| H03K 3/03 | (2006.01) |
| H03K 5/156 | (2006.01) |
| H03K 19/0185 | (2006.01) |
| H03L 7/099 | (2006.01) |
| H03K 19/003 | (2006.01) |
| H03K 19/0175 | (2006.01) |
| H03K 19/00 | (2006.01) |

(52) U.S. Cl.
CPC .......... *H03K 5/1565* (2013.01); *H03K 3/0315* (2013.01); *H03K 19/003* (2013.01); *H03K 19/0013* (2013.01); *H03K 19/017509* (2013.01); *H03K 19/018521* (2013.01); *H03L 7/099* (2013.01); *H03L 7/0995* (2013.01)

(58) Field of Classification Search
CPC  H03K 19/003; H03K 19/0013; H03K 5/1565; H03K 19/017509; H03L 7/0085; H03L 7/0995

USPC .......... 331/177 R, 57, 175, 74; 327/156, 333
See application file for complete search history.

(56) References Cited

U.S. PATENT DOCUMENTS

| | | |
|---|---|---|
| 5,239,274 A | 8/1993 | Chi |
| 5,682,123 A | 10/1997 | Chau |
| 5,942,947 A | 8/1999 | Bhagwan |
| 6,252,467 B1 | 6/2001 | Yoshimura |
| 6,747,497 B2 | 6/2004 | Ingino, Jr. |
| 7,230,505 B2 | 6/2007 | Rachedine et al. |
| 7,372,342 B2 | 5/2008 | Berens |
| 7,489,205 B2 | 2/2009 | Chatterjee |
| 7,876,165 B2 | 1/2011 | Li et al. |
| 8,289,094 B2 | 10/2012 | Wennekers et al. |
| 8,324,977 B2 | 12/2012 | Li et al. |
| 8,432,200 B1 | 4/2013 | Thakur |
| 2015/0188543 A1* | 7/2015 | Jain ................ H03K 19/017509 327/156 |

\* cited by examiner

*Primary Examiner* — Arnold Kinkead
(74) *Attorney, Agent, or Firm* — Charles E. Bergere

(57) ABSTRACT

A level shifter that shifts a voltage level of an input signal, where the input signal oscillates between a voltage level of a first supply voltage and ground. The level shifter includes a bias circuit, and first and second transistors. The bias circuit provides a bias voltage to the first transistor based on the first supply voltage. The second transistor is connected in series with the first transistor, and the series combination is connected between voltage supplies that provide second and third supply voltages. The second transistor receives the input signal at its gate, and a level-shifted version of the input signal is output at a node between the first and second transistors. The level-shifted signal oscillates between the voltage levels of the second and third supply voltages.

12 Claims, 1 Drawing Sheet

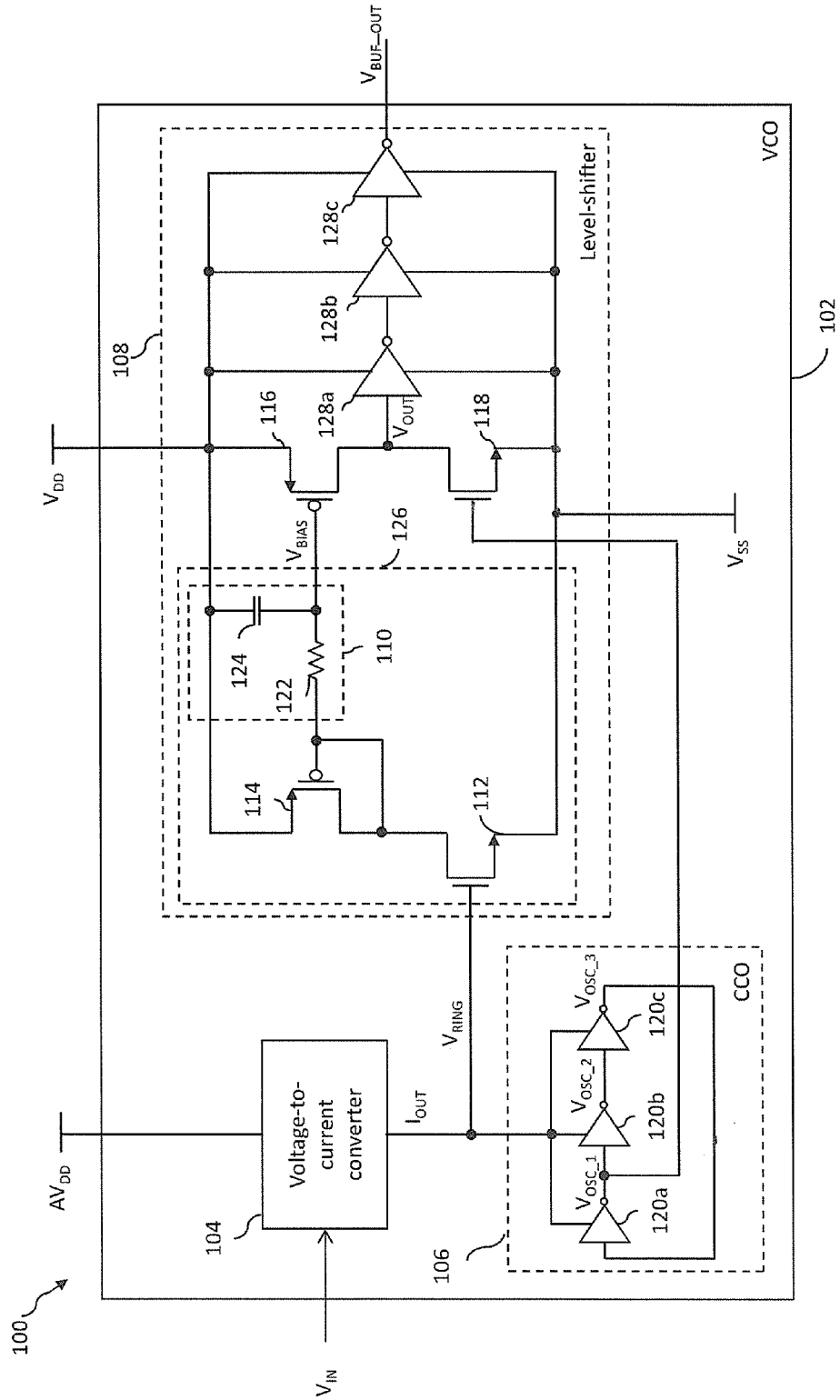

LEVEL SHIFTER WITH LOW DUTY CYCLE VARIATION

BACKGROUND

The present invention relates generally to integrated circuits, and, more particularly, to a level shifter circuit.

Level shifters are used in integrated circuits to shift voltage levels of signals that cross voltage domains that operate at different voltage levels. Phase-locked loop (PLL) circuits commonly use level shifters to shift the voltage level of an oscillating signal generated by a voltage-controlled oscillator (VCO) of the PLL. The frequency of the oscillating signal is controlled by an input control voltage. The VCO includes a voltage-to-current converter and a current-controlled oscillator (CCO). The voltage-to-current converter converts the input control voltage into a current input, and the CCO modulates the frequency of the oscillating signal based on the current input.

A ring oscillator is the most commonly used CCO and includes an odd number of cascade-connected inverters, for example, three cascade-connected inverters. Such a ring oscillator generates three oscillating signals that have a predetermined phase difference between them. Each oscillating signal oscillates from zero (i.e., ground voltage level) to a voltage level that is equal to a ring voltage of the CCO. The VCO includes a level shifter that is connected to the CCO to shift the voltage level of an oscillating signal to a supply voltage level of the level shifter.

A known technique for shifting the voltage level of an oscillating signal requires the oscillating signal and another oscillating signal from the CCO as inputs to the level shifter. This technique requires the two input signals to be exactly 180° out of phase with each other for the level shifter to maintain the duty cycle of the level-shifted oscillating signal equal to that of the input oscillating signals. However, since the CCO contains an odd number of cascade-connected inverters, the phase difference between any two oscillating signals is not 180°, and hence, this technique does not provide an effective solution. Further, in order to match capacitive loading at each phase of the CCO, a level shifter is required for each oscillating signal, leading to an increase in power consumption and circuit area.

Another known technique is to use a bias circuit along with the level shifter to adjust the operating points (i.e., the quiescent points) of transistors of the level shifter using the ring voltage. However, this technique requires a bias circuit for each oscillating signal, which increases power consumption and circuit area.

It would be advantageous to have a level shifter that does not increase circuit area and power consumption, and maintains the duty cycle of the level-shifted oscillating signal substantially equal to that of the oscillating signal input to the level shifter.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying FIGURES, in which like references indicate similar elements.

FIG. 1 is a schematic block diagram of a phase-locked loop (PLL) in accordance with an embodiment of the present invention.

DETAILED DESCRIPTION

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment, the present invention provides a level shifter that generates an output voltage based on an input voltage, where the input voltage oscillates between a voltage level of a first supply voltage and a ground voltage level. A first transistor has a gate that receives the first supply voltage, and a source that receives a second supply voltage. A second transistor has a drain connected to its gate and a drain of the first transistor, and a source that receives a third supply voltage. A third transistor has a source that receives the third supply voltage, and a gate connected to the gate of the second transistor. A fourth transistor has a gate that receives the input voltage, a source that receives the second supply voltage, and a drain connected to a drain of the third transistor for generating the output voltage. The output voltage oscillates between voltage levels of the second and third supply voltages.

In another embodiment, the present invention provides a voltage-controlled oscillator (VCO). The VCO includes a voltage-to-current converter, a current-controlled oscillator (CCO), and a level shifter. The voltage-to-current converter receives an input voltage and generates an output current. The CCO receives the output current and generates a plurality of oscillating signals that have a predetermined phase difference therebetween. A ring voltage is output from a node between the voltage-to-current converter and the CCO. A first transistor has a gate that receives the ring voltage, and a source that receives a first supply voltage. A second transistor has a drain connected to its gate and a drain of the first transistor, and a source that receives a second supply voltage. A third transistor has a gate connected to the gate of the second transistor, and a source that receives the second supply voltage. A fourth transistor has a gate connected to the CCO for receiving a first oscillating signal of the plurality of oscillating signals, a source that receives the first supply voltage, and a drain connected to a drain of the third transistor for generating the output voltage. The first oscillating signal oscillates between a voltage level of the ring voltage and ground, and the output voltage oscillates between voltage levels of the first and second supply voltages.

In yet another embodiment, the present invention provides a phase-locked loop (PLL) that includes a VCO having a voltage-to-current converter, a CCO, and a level shifter. The voltage-to-current converter receives an input voltage and generates an output current. The CCO receives the output current and generates a plurality of oscillating signals therefrom that have a predetermined phase difference therebetween. A ring voltage is output from a node between the voltage-to-current converter and the CCO. A first transistor has a gate that receives the ring voltage, and a source that receives a first supply voltage. A second transistor has a drain connected to its gate and a drain of the first transistor, and a source that receives a second supply voltage. A third transistor has a gate connected to the gate of the second transistor, and a source that receives the second supply voltage. A fourth transistor has a gate connected to the CCO for receiving a first oscillating signal of the plurality of oscillating signals, a source that receives the first supply voltage, and a drain connected to a drain of the third transistor for generating the output voltage. The first oscillating signal oscillates between a voltage level of the ring voltage and ground, and the output voltage oscillates between voltage levels of the first and second supply voltages.

Various embodiments of the present invention provide a level shifter that includes first through fourth transistors. The first transistor has a gate that receives a first supply voltage and a source that receives a second supply voltage. The second transistor has a drain connected to its gate and a drain of the first transistor, and a source that receives a third supply voltage. The third transistor has a source that receives the third supply voltage, and a gate that is connected to the gate of the second transistor. The fourth transistor has a gate that receives an input voltage, a source that receives the second supply voltage, and a drain that is connected to a drain of the third transistor for generating an output voltage. Thus, the second and third transistors form a current mirror, and the third and fourth transistors form an inverter stage. The input voltage oscillates between a voltage level of the first supply voltage and ground (i.e., a ground voltage level), and the output voltage oscillates between voltage levels of the second and third supply voltages.

The level-shifted output signal has substantially the same duty cycle as that of the oscillating signal input to the level shifter. Further, when used in a PLL, the same bias circuit can be used for each oscillating signal of the PLL, thereby reducing power consumption and the circuit area.

Referring now to FIG. 1, a schematic block diagram of a phase-locked loop (PLL) 100 in accordance with an embodiment of the present invention is shown. The PLL 100 includes a voltage-controlled oscillator (VCO) 102 that includes a voltage-to-current converter 104, a current-controlled oscillator (CCO) 106, and a level shifter 108. The level shifter 108 includes a low-pass filter 110 and first through fourth transistors 112-118. In the presently preferred embodiment, the first and fourth transistors 112 and 118 are n-channel metal-oxide semiconductor (NMOS) transistors, the second and third transistors 114 and 116 are p-channel metal-oxide semiconductor (PMOS) transistors, and the low-pass filter 110 is a resistance-capacitance (RC) filter.

The voltage-to-current converter 104 receives a first supply voltage ($AV_{DD}$) and an input voltage ($V_{IN}$), and generates an output current ($I_{OUT}$).

The CCO 106 is connected between the voltage-to-current converter 104 and ground, and receives the output current ($I_{OUT}$). In the presently preferred embodiment, the CCO 106 is a ring oscillator and includes first through third cascade-connected inverters 120a-120c that generate first through third oscillating signals ($V_{OSC\_1}$-$V_{OSC\_3}$), respectively (collectively referred to as the oscillating signals ($V_{OSC}$)) based on the output current ($I_{OUT}$). A ring voltage ($V_{RING}$) is output from a node between the voltage-to-current converter 104 and the CCO 106. The oscillating signals ($V_{OSC}$) have a predetermined phase difference between them and oscillate between a voltage level of the ring voltage ($V_{RING}$) and a ground voltage level (i.e., zero).

A source of the first transistor 112 receives a second supply voltage ($V_{SS}$) and a gate thereof is connected to the node between the voltage-to-current converter 104 and the CCO 106 to receive the ring voltage ($V_{RING}$). A drain of the second transistor 114 is connected to its gate and a drain of the first transistor 112, and a source thereof receives a third supply voltage ($V_{DD}$). A gate of the third transistor 116 is connected to the gate of the second transistor 114 by way of a resistor 122 and a source thereof receives the third supply voltage ($V_{DD}$). A capacitor 124 is connected between the gate of the third transistor 116 and a voltage supply (not shown) that provides the third supply voltage ($V_{DD}$). A gate of the fourth transistor 118 is connected to the CCO 106 to receive the first oscillating signal ($V_{OSC\_1}$) and a source thereof receives the second supply voltage ($V_{SS}$). A drain of the fourth transistor 118 is connected to the drain of the third transistor 116 to generate an output voltage ($V_{OUT}$). Since the supply voltages received by the level shifter 108 are the second and third supply voltages ($V_{SS}$ and $V_{DD}$), the output voltage ($V_{OUT}$) oscillates between voltage levels of the second and third supply voltages ($V_{SS}$ and $V_{DD}$). In one embodiment, the second supply voltage ($V_{SS}$) is ground, i.e., the voltage level of the second supply voltage ($V_{SS}$) is equal to the ground voltage level. In another embodiment, the voltage level of the second supply voltage ($V_{SS}$) is different from the ground voltage level. The resistor 122 and the capacitor 124 form the low-pass filter 110, and the first and second transistors 112 and 114 and the low-pass filter 110 form a bias circuit 126.

In the presently preferred embodiment, the level shifter 108 includes series-connected fourth through sixth inverters 128a-128c that buffer the output voltage ($V_{OUT}$), and THEREBY OUTPUT A BUFFERED OUTPUT VOLTAGE ($V_{BUF\_OUT}$). Each inverter 128 is a complementary metal-oxide semiconductor (CMOS) inverter. For each oscillating signal ($V_{OSC}$), a four-stage inverter, similar to the four-stage inverter formed by the third and fourth transistors 116 and 118 and the inverters 128, is required to buffer the oscillating signal ($V_{OSC}$). Moreover, the same bias circuit 126 can be used with each four-stage inverter. Thus, the level shifter 108 requires less circuit area and power. The use of a four-stage inverter for each oscillating signal ($V_{OSC}$) of the CCO 106 ensures equalization of capacitive loading at each phase of the CCO 106. It will be understood by those with skill in the art that any number of the inverters 128 can be used to buffer an oscillating signal ($V_{OSC}$).

An increase in the output current ($I_{OUT}$) increases the ring voltage ($V_{RING}$), which in turn increases the frequency and the amplitude of the oscillating signals ($V_{OSC}$) and the current through the first and second transistors 112 and 114. An increase in the amplitude of the oscillating signals ($V_{OSC}$) results in an increase in the current through the fourth transistor 118 as well as in the current through the first and second transistors 112 and 114 and results in a decrease in the bias voltage ($V_{BIAS}$) received by the third transistor 116 at its gate. Similarly, a decrease in the output current ($I_{OUT}$) results in a decrease in the frequency and amplitude of the oscillating signals ($V_{OSC}$) and the current through the first and second transistors 112 and 114, which in turn increase the bias voltage ($V_{BIAS}$). Thus, when the current through the fourth transistor 118 increases, the current through the third transistor 116 also increases, i.e., when the fourth transistor 118 becomes stronger, the third transistor 116 also becomes stronger. Similarly, when the fourth transistor 118 becomes weaker, the third transistor 116 also becomes weaker.

Thus, the charging and discharging rates of an output node of the level shifter 108 formed by the connection of the drains of the third and fourth transistors 116 and 118 vary based on the ring voltage ($V_{RING}$), and hence, the duty cycle of the output voltage ($V_{OUT}$) is substantially equal to that of the first oscillating signal ($V_{OSC\_1}$) even at high frequencies of the first oscillating signal ($V_{OSC\_1}$).

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A level shifter for generating an output voltage based on an input voltage, comprising:
   a first transistor having a gate that receives a first supply voltage and a source that receives a second supply voltage, wherein the input voltage oscillates between a voltage level of the first supply voltage and a ground voltage level;
   a second transistor having a gate connected to its drain, a drain connected to a drain of the first transistor, and a source that receives a third supply voltage;
   a third transistor having a gate connected to the gate of the second transistor, and a source that receives the third supply voltage;
   a fourth transistor having a gate that receives the input voltage, a source that receives the second supply voltage, and a drain connected to a drain of the third transistor, wherein the output voltage is generated at a node between the drains of the third and fourth transistors, and wherein the output voltage oscillates between voltage levels of the second and third supply voltages; and
   a low-pass filter that connects the gate of the second transistor to the gate of the third transistor.

2. The level shifter of claim 1, wherein the low-pass filter comprises:
   a resistor connected between the gate of the second transistor and the gate of the third transistor; and
   a capacitor connected between the gate of the third transistor and the sources of the second and third transistors.

3. The level shifter of claim 1, further comprising at least one inverter that buffers the output voltage.

4. The level shifter of claim 1, wherein the first and fourth transistors are n-channel metal-oxide semiconductor (NMOS) transistors, and the second and third transistors are p-channel metal-oxide semiconductor (PMOS) transistors.

5. A voltage-controlled oscillator (VCO), comprising:
   a voltage-to-current converter that receives an input voltage and generates an output current;
   a current-controlled oscillator (CCO) connected to the voltage-to-current converter and includes a plurality of inverters that receive the output current and generate corresponding plurality of oscillating signals, wherein the plurality of oscillating signals have a predetermined phase difference therebetween, and wherein a ring voltage is output from a node between the voltage-to-current converter and the CCO, and wherein each oscillating signal of the plurality of oscillating signals oscillates between a voltage level of the ring voltage and a ground voltage level; and
   a level shifter that generates an output voltage based on the ring voltage and a first oscillating signal of the plurality of oscillating signals, comprising:
      a first transistor having a gate connected to the node between the voltage-to-current converter and the CCO for receiving the ring voltage, and a source that receives a first supply voltage;
      a second transistor having a drain connected to a drain of the first transistor, a gate connected to its drain, and a source that receives a second supply voltage;
      a third transistor having a gate connected to the gate of the second transistor and a source that receives the second supply voltage;
      a fourth transistor having a gate connected to the CCO for receiving the first oscillating signal of the plurality of oscillating signals, a source that receives the first supply voltage, and a drain connected to a drain of the third transistor for generating the output voltage, wherein the output voltage oscillates between voltage levels of the first and second supply voltages; and
      a low-pass filter that connects the gate of the second transistor to the gate of the third transistor.

6. The VCO of claim 5, wherein the low-pass filter comprises:
   a resistor connected between the gate of the second transistor and the gate of the third transistor; and
   a capacitor connected between the gate of the third transistor and a voltage supply that provides the second supply voltage.

7. The VCO of claim 5, wherein the level shifter further comprises at least one inverter that buffers the output voltage.

8. The VCO of claim 5, wherein the first and fourth transistors are n-channel metal-oxide semiconductor (NMOS) transistors, and the second and third transistors are p-channel metal-oxide semiconductor (PMOS) transistors.

9. A phase-locked loop (PLL), comprising:
   a voltage-controlled oscillator (VCO), comprising:
      a voltage-to-current converter that receives an input voltage and generates an output current;
      a current-controlled oscillator (CCO) connected to the voltage-to-current converter and includes a plurality of inverters that receive the output current and generate corresponding plurality of oscillating signals, wherein the plurality of oscillating signals have a predetermined phase difference therebetween, and wherein a ring voltage is output from a node between the voltage-to-current converter and the CCO, and wherein each oscillating signal of the plurality of oscillating signals oscillates between a voltage level of the ring voltage and a ground voltage level; and
   a level shifter for generating an output voltage based on the ring voltage and a first oscillating signal of the plurality of oscillating signals, comprising:
      a first transistor having a gate connected to the node between the voltage-to-current converter and the CCO for receiving the ring voltage, and a source that receives a first supply voltage;
      a second transistor having a drain connected to a drain of the first transistor, a gate connected to its drain, and a source that receives a second supply voltage;
      a third transistor having a gate connected to the gate of the second transistor and a source that receives the second supply voltage;
      a fourth transistor having a gate connected to the CCO for receiving the first oscillating signal of the plurality of oscillating signals, a source that receives the first supply voltage, and a drain connected to a drain of the third transistor for generating the output voltage, wherein the output voltage oscillates between voltage levels of the first and second supply voltages; and
      a low-pass filter that connects the gate of the second transistor to the gate of the third transistor.

10. The PLL of claim 9, wherein the low-pass filter comprises:

a resistor connected between the gate of the second transistor and the gate of the third transistor; and a capacitor connected between the gate of the third transistor and a voltage supply that provides the second supply voltage.

11. The PLL of claim 9, wherein the level shifter further comprises at least one inverter that buffers the output voltage.

12. The PLL of claim 9, wherein the first and fourth transistors are n-channel metal-oxide semiconductor (NMOS) transistors, and the second and third transistors are p-channel metal-oxide semiconductor (PMOS) transistors.

* * * * *